United States Patent
Hamilton et al.

(10) Patent No.: US 7,203,922 B2
(45) Date of Patent: Apr. 10, 2007

(54) MERGING OF INFRASTRUCTURE WITHIN A DEVELOPMENT ENVIRONMENT

(75) Inventors: Robert Anson Hamilton, Mountain View, CA (US); Stanley Ted Jefferson, Palo Alto, CA (US); Randy Allen Coverstone, Newark, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 407 days.

(21) Appl. No.: 10/858,765

(22) Filed: Jun. 1, 2004

(65) Prior Publication Data

US 2005/0278684 A1 Dec. 15, 2005

(51) Int. Cl.
  *G06F 17/50* (2006.01)
  *G06F 9/455* (2006.01)
(52) U.S. Cl. .............................. 716/18; 716/1; 716/11
(58) Field of Classification Search ............... 716/1, 716/11, 18
  See application file for complete search history.

(56) References Cited

U.S. PATENT DOCUMENTS

| | | | |
|---|---|---|---|
| 6,425,116 B1 * | 7/2002 | Duboc et al. ............... 716/18 |
| 6,581,186 B1 * | 6/2003 | Frost et al. ................. 716/1 |
| 6,643,826 B2 * | 11/2003 | Abe ............................ 716/1 |
| 6,961,913 B1 * | 11/2005 | Okazaki et al. ............. 716/1 |
| 6,973,630 B1 * | 12/2005 | Dao et al. .................... 716/1 |
| 2004/0128641 A1 * | 7/2004 | Broberg et al. ............ 716/18 |
| 2005/0114818 A1 * | 5/2005 | Khakzadi et al. .......... 716/11 |

OTHER PUBLICATIONS

"Push-Button Performance using System Generator for DSP", Available from www.xillinx.com or Xilinx, Inc. 2100 Logic Drive, San Jose, CA 95124, PN 0010676-1, 2003.

\* cited by examiner

*Primary Examiner*—Vuthe Siek
*Assistant Examiner*—Magid Y. Dimyan

(57) ABSTRACT

A development environment includes a graphical design tool and a build agent. The graphical design tool allows a designer to design a primary logic component of a circuit. The graphical design tool generates modules using a hardware description language to represent the primary logic component of the circuit. The modules include abstract references to infrastructure for the circuit. The build agent synthesizes the modules into netlists and merges the netlists with a description of the infrastructure for the circuit. The infrastructure is generated in a development environment separate from the graphical design tool. The build agent includes an adjuster that adjusts the modules. The adjustment to the modules includes replacing the abstract references to the infrastructure with actual references utilized within the infrastructure.

20 Claims, 6 Drawing Sheets

MERGING OF INFRASTRUCTURE WITHIN A DEVELOPMENT ENVIRONMENT

BACKGROUND

High-level, graphical design tools are often used in the design of programmable logical devices (PLDs) such as field-programmable gate arrays (FPGAs). For example, System Generator for DSP® available from Xilinx, Inc., runs within the modeling environment of Simulink® available from The MathWorks, Inc. and can be used to express, simulate and synthesize control and digital signal processing (DSP) algorithms embodied as primary logic components within field programmable gate arrays (FPGAs). However, in existing design environments, it is necessary to employ comparatively tedious hardware description languages (HDL) such as Verilog® and VHDL® in order to implement infrastructure and off-chip input-output (I/O) interfaces. This involves, for example, the detailed specification of interface circuitry, as well as the configuration of impedances, drive levels, phase delays, supply voltages and the clocking schemes and timing offsets of specialized subcircuits associated with clock management, busses, and other off-chip input-output (I/O) functions.

HDL design environments needed to specify infrastructure and off-chip I/O characteristics, have also traditionally served as the "top-level" or master design environment for PLD design flows. It is within the top-level design environment where the merging of infrastructure subcircuits with the machine-generated logic produced by the high-level, graphical design tools occurs.

It has therefore been necessary that application and domain experts who use the high-level, graphical design tools maintain competency with HDL design environments in order to generate a final PLD image and verify the resulting design in-circuit. This maintenance of competency has been necessary because during the development of PLD application it may frequently be necessary to implement and deploy prototypical designs, not only to verify primary logic components, but also to provide in-circuit test harness for additional system elements that are external to the PLD, and to verify communication schemes between the PLD and other attached hardware.

SUMMARY OF THE INVENTION

In accordance with an embodiment of the present invention, a development environment includes a graphical design tool and a build agent. The graphical design tool allows a designer to design a primary logic component of a circuit. The graphical design tool generates modules using a hardware description language to represent the primary logic component of the circuit. The modules include abstract references to infrastructure for the circuit. The build agent synthesizes the modules into netlists and merges the netlists with a description of the infrastructure for the circuit. The infrastructure is generated in a development environment separate from the graphical design tool. The build agent includes an adjuster that adjusts the modules. The adjustment to the modules includes replacing the abstract references to the infrastructure with actual references utilized within the infrastructure.

DESCRIPTION OF THE EMBODIMENT

Figure 1:
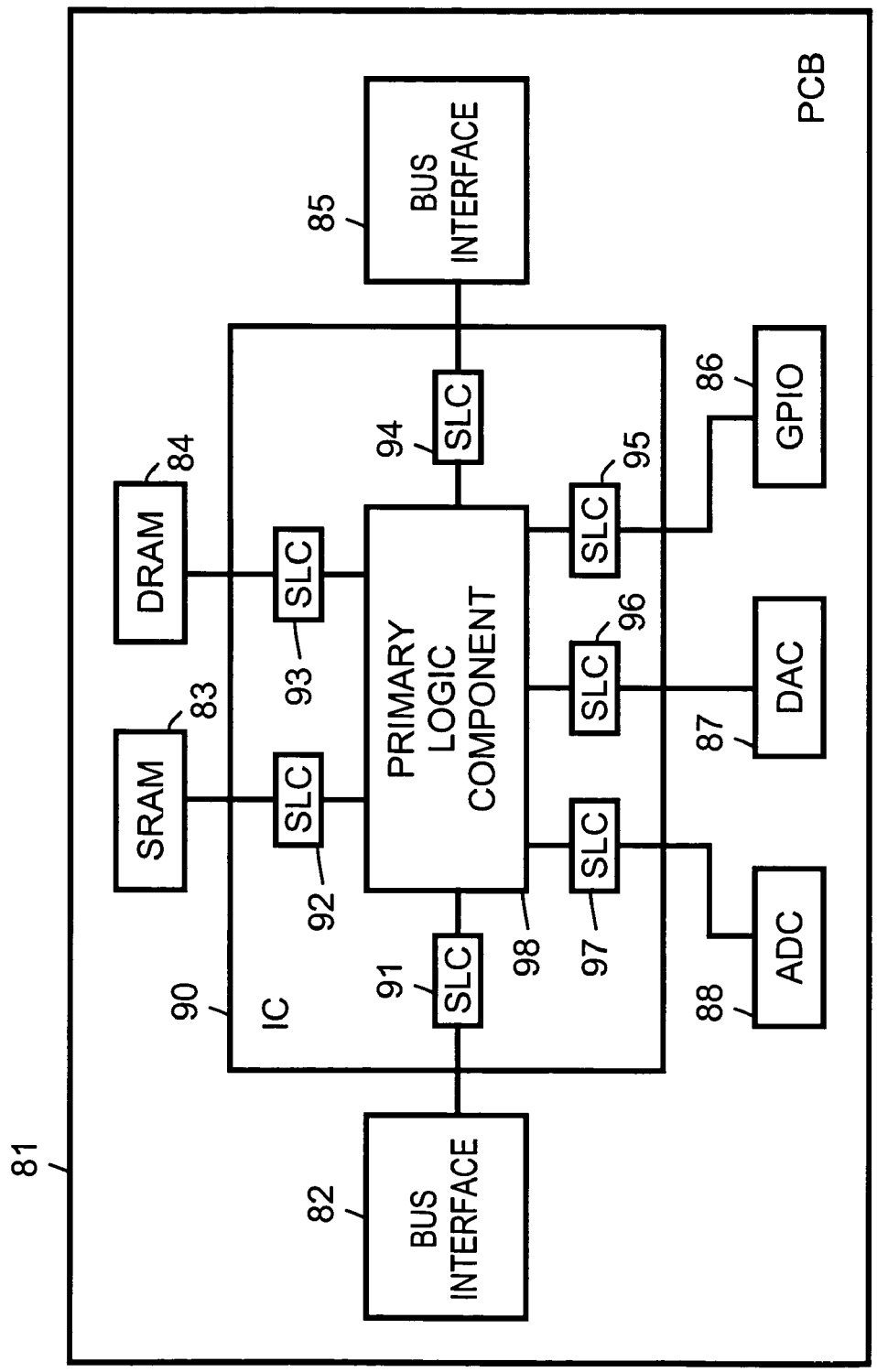
FIG. 1 is a simplified block diagram of a printed circuit board (PCB) that includes an integrated circuit.

FIG. 1 is a simplified block diagram of a printed circuit board (PCB) 81. PCB 81 includes an integrated circuit (IC) 90. For example, IC 90 is a programmable logic device (PLD), such as a field-programmable gate array (FPGA).

IC 90 includes a primary logic component 98. For example, primary logic component 98 includes algorithms for digital signal processing. Alternatively primary logic component performs other functions such as complex mathematical operations associated with, for example, measurement, test, control, or communications.

IC 90 includes additional logic blocks referred to herein as support logic components (SLC). By way of illustration FIG. 1 shows seven SLCs: SLC 91, SLC 92, SLC 93, SLC 94, SLC 95, SLC 96 and SLC 97. For example, SLC 91 is an interface for IC 90 to a bus interface 82. For example, bus interface 82 is an interface to a peripheral component interconnect (PCI) bus or some other type of bus. For example, SLC 92 is an interface for IC 90 to static random access memory (SRAM) 83. For example, SLC 93 is an interface for IC 90 to dynamic random access memory (DRAM) 84. For example, SLC 94 is an interface for IC 90 to a bus interface 85. For example, bus interface 85 is an interface to a low voltage differential signaling (LVDS) bus or some other type of bus. For example, SLC 95 is an interface for IC 90 to general-purpose input/output GPIO 86. For example, SLC 96 is an interface for IC 90 to a digital-to-analog converter (DAC) 87. For example, SLC 97 is an interface for IC 90 to an analog-to-digital converter (ADC) 88. Additional candidates for SLCs include system components or interfaces to system components such as, for example: application specific integrated circuits (ASICs), microprocessors, microcontrollers, other PLDs, memory subsystems including and in addition to SRAM and DRAM, digital signal processors, transducers, and communications ICs or subsystems. SLCs can also include circuitry to provide clocks to digital logic and/or circuitry to provide synchronization to digital logic.

Figure 2:
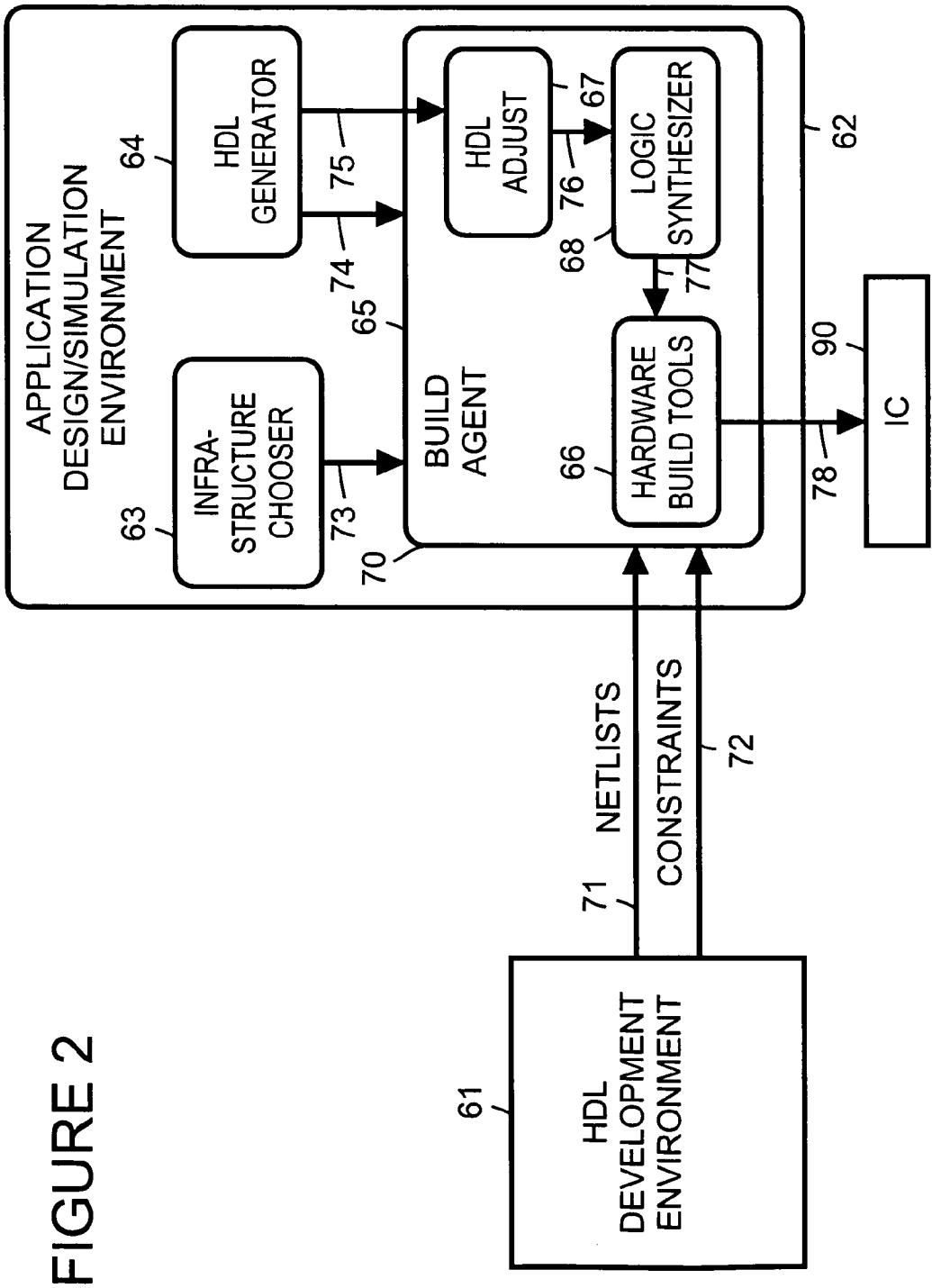
FIG. 2 shows a simplified block diagram of a design environment in accordance with an embodiment of the present invention.

FIG. 2 shows a simplified block diagram of a design environment used to design and simulated integrated circuits such as IC 90 shown in FIG. 1. A hardware description language (HDL) development environment 61 is used to design infrastructure circuits. The infrastructure circuits include SLCs such as SLCs 91 through 97 shown in FIG. 1. In addition to describing infrastructure circuitry, HDL development environment 61 is used, for example, to configure the impedances, drive levels, phase delays, supply voltages, clocking schemes and timing offsets of specialized subcircuits, such as SLCs, associated with clock management, busses, and other off-chip input-output (I/O) functions.

For example, HDL development environment 61 is a commercially available HDL development environment that uses a hardware description language (HDL) such as Verilog® or VHDL®. HDL development environment 61 makes available information, such as netlists 71 and constraints 72, to a build agent 70 within an application design/simulation environment 62. For example netlists 71 are electronic design interchange format (EDIF) netlists. For example constraints 72 are in the form of a user constraints file (UCF), whose format is defined by Xilinx, Inc. A UCF file contains, for example: subcircuit placement data, pin-out choices, drive levels, termination choices, pin-to-pin delays, output delays relative to inbound clock edges, and data about input signals' arrivals prior to inbound clock edges.

Application design/simulation environment 62 includes an HDL generator 64. HDL generator 64 generates hardware description language describing primary logic components such as primary logic component 98 shown in FIG. 1. HDL generator 64 makes available information, such as hardware descriptions 75 and constraints 74, to a build agent 70 within a graphical application design/simulation environment 62. For example, HDL generator 64 is implemented using System Generator for DSP® available from Xilinx, Inc. For example, hardware descriptions 75 are Very High Speed Integrated Circuit (VHSIC) Hardware Description Language (VHDL) modules. For example constraints 74 are in the form of UCF or NCF from Xilinx, Inc.

Application design/simulation environment 62 also includes an infrastructure chooser 63. Infrastructure chooser 63 selects which sets of SLCs available from HDL development environment 61 are to be included, for example, within IC 90 or other designed hardware. Infrastructure chooser 63 forwards SLC selections 73 to build agent 70.

Build agent 70 includes an HDL adjust component 67. HDL adjust component 67 makes adjustments to hardware descriptions 75, as further described below, and forwards the resulting adjusted hardware descriptions 76 to a logic synthesizer 68. Logic synthesizer 68 synthesizes adjusted hardware descriptions 76 to produce netlists 77. Netlists 77 are of a type depending upon the vendor that provides hardware build tools 66. For example, netlists 77 are EDIF netlists. Netlists 77 are sent to hardware build tools 66. Hardware build tools 66 are vendor-specific back-end tools that accept netlists and produce finished circuit configurations for programmable logic devices. For example, hardware build tools 66 are vendor-specific back-end tools used to generate an FPGA bitstream 78 that implements IC 90 as an FPGA circuit. For example, hardware build tools 66 are Xilinx ISE Alliance build tools.

Figure 3:
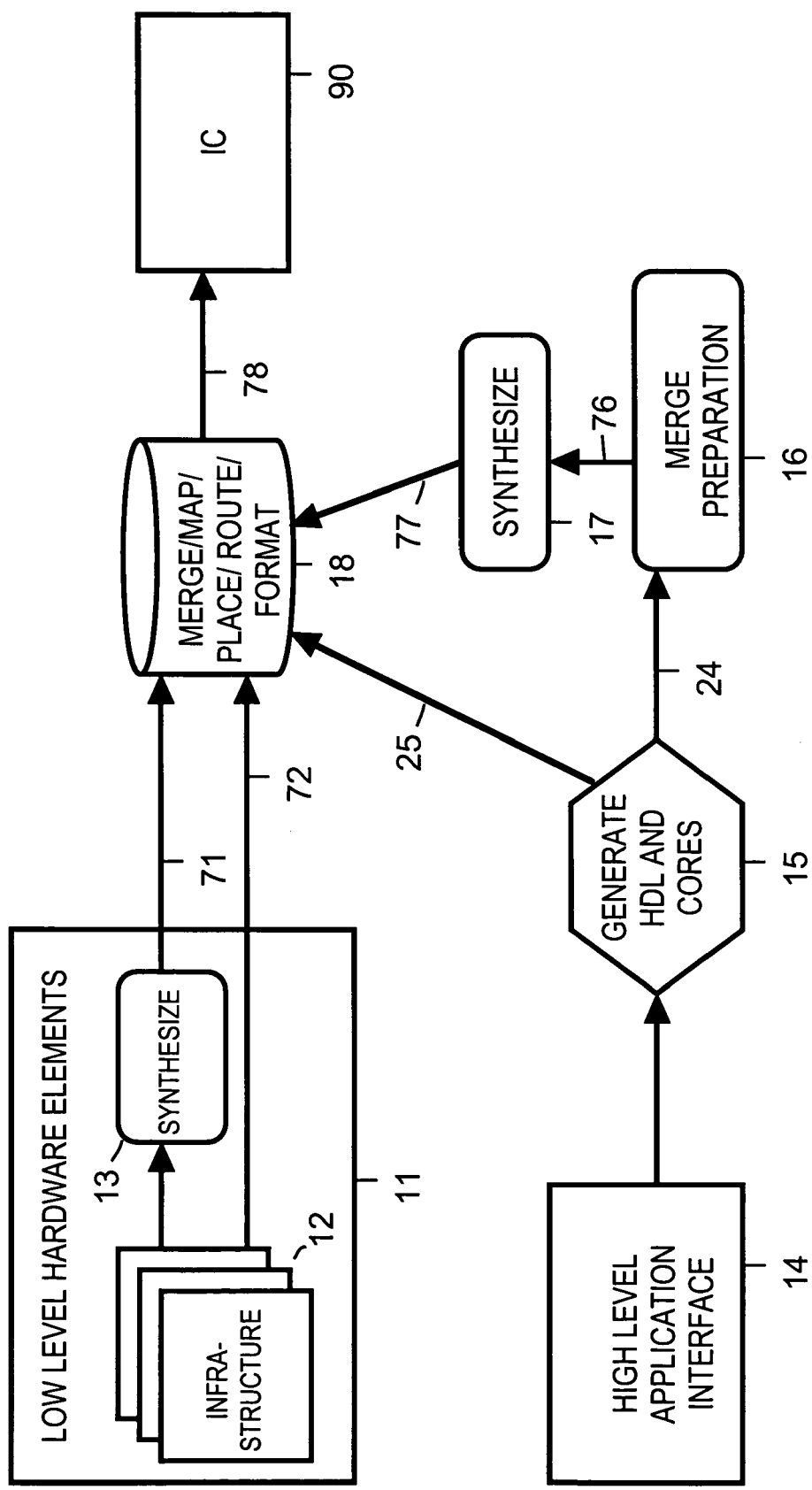
FIG. 3 is a simplified flow diagram that illustrates process flow within a design environment in accordance with an embodiment of the present invention.

FIG. 3 is a simplified flow diagram that illustrates process flow for producing a circuit configuration for IC 90. Low-level hardware elements 11 are developed within HDL development environment 61 (shown in FIG. 2). An infrastructure set 12 includes the SLCs selected when designing the configuration of IC 90.

For example, infrastructure set 12 is developed using VHDL modules. The VHDL modules go through a synthesize process 13 to generate netlists 71, which are, for example, EDIF netlists. Constraints 72 are also specified for infrastructure 12. Low-level hardware elements 11 are designed by an HDL expert skilled with the particular HDL, such as VHDL, the hardware build tools 66 (shown in FIG. 2), the language or format in which constraints are expressed, and the target IC architecture.

Within application design/simulation environment (shown in FIG. 2) a designer utilizes a graphical, high-level application design and simulation environment 14 (essentially equivalent to graphical, high-level application design and simulation environment 62). For example, graphical, high-level application design and simulation environment 14 is a modern, graphical, high-level simulation/modeling environment, for example, Simulink® available from The MathWorks, Inc. Within graphical, high-level application design and simulation environment 14, references can be made, as described below, to infrastructure 12 so that the designer can generate a complete circuit description for IC 90 without leaving the high-level simulation/modeling environment. Furthermore, from the perspective of the designer, hardware that is external to IC 90, such as bus interface 82, SRAM 83, DRAM 8,4 bus interface 85, GPIO 86, DAC 87, ADC 88, or any other SLC associated hardware, as described above, can be individually dragged, dropped and manipulated as a component within the graphical, high-level simulation/modeling environment. Additionally, a user of the high-level environment can push these elements into more deeply-nested subsystems, wrap them in user-specified logic, and cause them to manifest with alternative or more abstract interfaces, without resorting to changes in low-level, infrastructure-related HDL.

Within HDL generator 64 (shown in FIG. 2) a generate HDL and cores process 15 occurs to generate netlist cores 25 and hardware descriptions 24. For example, hardware descriptions 24 (essentially the same as hardware descriptions 75) are VHDL modules. For example, netlist cores 25 are EDIF netlist cores. Netlist cores are netlisted subsystems optimized for a particular architecture, calling out its circuit primitives. Netlist cores are generated directly for some blocks, bypassing intermediate representation as VHDL, at the discretion of the user of the high-level environment and/or HDL generator 64.

Within HDL adjust component 67 (shown in FIG. 2), a merge preparation process 16 generates adjusted hardware descriptions 76. Merge preparation process 16 adjusts hardware descriptions 75 so that the top-level "port names" of the overall subsystem defined by graphical, high-level application design and simulation environment 14 make reference to "port names" provided by infrastructure 12. This may be necessitated by circumstances wherein the top-level "port names" produced by HDL generator 64 are sensitive to the depth and location at which the user of the graphical simulation/modeling environment has chosen to place the SLC references within his application. The adjusted hardware descriptions 76 include the port names provided by infrastructure 12, so that it will be possible for hardware build tools 66 (shown in FIG. 2) to recognize how the primary component defined by hardware descriptions 75 is interconnected with infrastructure 12. This enables a "merge" between the primary component defined by hardware descriptions 75 and infrastructure 12. In this way, the functionality of the primary component defined by hardware descriptions 75 can be embedded in the enclosing infrastructure 12 by hardware build tools 66.

Within logic synthesizer 68 (shown in FIG. 2) a synthesize process produces netlists 77. For example, netlists 77 are EDIF netlists.

Within hardware build tools 66, a merge/map/place/route and format process 18 generates a vendor-specific circuit description 78 that implements IC 90. For example, vendor-specific circuit description 78 is an FPGA "bitstream" from which an FPGA can establish its circuit configuration.

Within hardware build tools 66, netlists 77 are subordinate to netlists 71 and thus graphical, high-level application design and simulation environment 14 can be considered to generate a subsystem that is intrinsically subordinate to low-level hardware elements 11. However, to the designer using graphical, high-level application design and simulation environment 14, hardware elements 11, together with their associated SLCs, are represented as components of his application, with each such component appearing to be subordinate to his primary logic component. Each such component includes not only an SLC but also a model of the hardware external to IC 90 that is connected to that SLC. In this way, infrastructure 12 can be represented and utilized within graphical, high-level application design and simulation environment 14. Since infrastructure 12 is developed separately within HDL development environment 61 (shown in FIG. 2), the designer using graphical, high-level application design and simulation environment 14 can, in effect, produce a complete design for IC 90 without concern for detailed infrastructure circuit issues, such as the provision of various clock phases and frequencies to the primary logic component, as well as to infrastructure circuits and to off-chip logic; management of complex external device needs, such as DRAM refresh cycles; critical sequencing of on-chip or off-chip resource access; and so on. The designer using graphical, high-level application design and simulation environment 14 can also operate without knowledge of hardware build tools 66, due to build agent 65.

Typically, infrastructure 12 is generated at the start of a project. Infrastructure 12 includes low-level hardware elements that will be needed by a designer using graphical, high-level application design and simulation environment 14. For example, infrastructure 12 includes all the SLCs that will be needed by the designer using graphical, high-level application design and simulation environment 14. Once infrastructure 12 is complete, the designer uses graphical, high-level application design and simulation environment 14 to produce a complete integrated circuit design in a streamlined manner. The designer is thus able to iterate through multiple cycles of design, simulation, synthesis, deployment and in-circuit verification, without further need of assistance from personnel knowledgeable in HDL-level design.

Within graphical, high-level application design and simulation environment 14 the design hierarchy appears to be reversed. That is, the designer is able to drag and drop elements of infrastructure 12 within a graphical view. In the view of the designer, the design of the primary component (e.g., primary logic component 98 shown in FIG. 1) constitutes the apparent top-level of design. The primary component is thereby able to utilize elements of infrastructure 12, treating them as sub-components.

However, due to the hierarchy-reversing actions of merge preparation process 16 (as shown in FIG. 3, also shown as HDL Adjust 67 in FIG. 2), hardware build tools 66 are readily able to merge the primary component, as defined in netlists 77, within infrastructure 12, as defined in netlists 71.

Within graphical, high-level application design and simulation environment 14, a naming convention is used to aid HDL adjust component 67 in producing a set of port names for the top-level of the primary logic component, which will exactly match the set that is expected by infrastructure 12.

In order to do this, some of the subsystems in graphical, high-level application design and simulation environment 14 are seeded with certain artifacts that result in cues appearing in hardware descriptions 75. These cues (also called meta-data) are, for example, revealed in a particular "dummy" port name, one of which is required in each subsystem that directly interfaces to infrastructure.

Additionally, HDL adjust component 67 will rename the HDL entity corresponding to the overall subsystem for which HDL Generator 64 has produced hardware descriptions 75. The subsystem entity, or type name is, for example, coerced to be "sdisbx". Infrastructure 12 would reference this type name, for example. Also, the file holding the root for this subsystem is similarly renamed, as "sdisbx.vhd", for example. This subsystem, which corresponds to the primary logic component, thereby manifests to logic synthesizer 67, and thus to hardware build tools 66, with invariant names for the following items: the HDL "entity" (a type name); the file holding the top-level of adjusted hardware descriptions 76; the file holding the top-level of netlists 77; and, the "port names", which collectively describe the connections between the low-level infrastructure's netlists 71 and the primary logic component's netlists 77. The invariance in these names simplifies the merge process within hardware build tools 66.

If necessary, HDL adjust component 67 will use cues in hardware descriptions 75 to help coerce port names to agree between the newly generated subsystem and the port names that infrastructure 12 expects. In particular, graphical, high-level application design and simulation environment 14 may intrinsically produce port names for a subsystem in which the desired port name has been prepended with tokens that reflect the name of each level of an enclosing component that existed above the subsystem, as it appeared in the view provided by graphical, high-level application design and simulation environment 14. When this occurs, the artifacts, whose names are effectively reserved, will have their names affected in the same manner. HDL adjust component 67 recognizes the name transformation that the artifact has experienced and applies an inverse name transformation to the names of any ports dwelling in the same infrastructure-wrapping subsystem as the artifact.

Optionally, graphical, high-level application design and simulation environment 14 generates VHDL in which the user blocks that specify port names for the new application subsystem do not result in varying port names, whether or not they are placed in different or more deeply nested subsystems in the application design view.

Build Agent 70 renames the output files from hardware build tools 66 to agree with the root name of the original design/model file in application design/simulation environment 62. This aids with configuration management and, in effect, reverses some of the coerced naming that occurred to facilitate the merging of the primary component with infrastructure 12.

Figure 4:
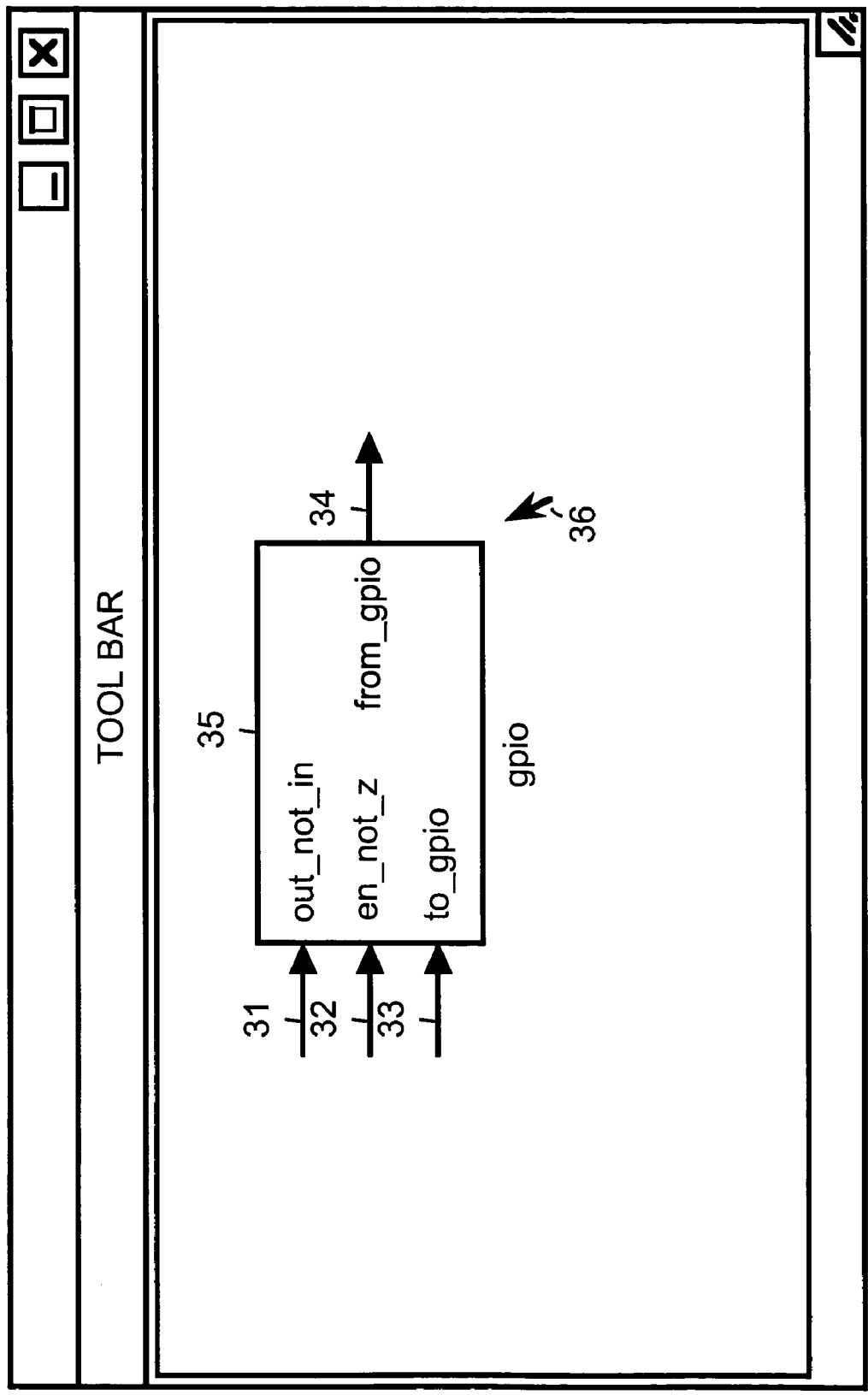
FIG. 4 and FIG. 5 show simplified screen shots of a graphical user interface for a graphical design tool in accordance with an embodiment of the present invention.

FIG. 4 shows a window 30 generated by graphical, high-level application design and simulation environment 14 (shown in FIG. 3). Graphical, high-level application design and simulation environment 14 is a graphical design tool. Within window 30, a gpio subsystem 35 represents functionality both of GPIO 86 and SLC 95, shown in FIG. 1. A designer using graphical, high-level application design and simulation environment 14 is presented with many such subsystems of infrastructure 12. The designer utilizes such subsystems by wiring together these subsystems, along with logic blocks provided by the vendor of graphical, high-level application design and simulation environment 14.

GPIO subsystem 35 is shown to have an out_not_in input 31, an en_not_z input 32, a to_gpio input 33 and a from_gpio output 34.

Figure 5:
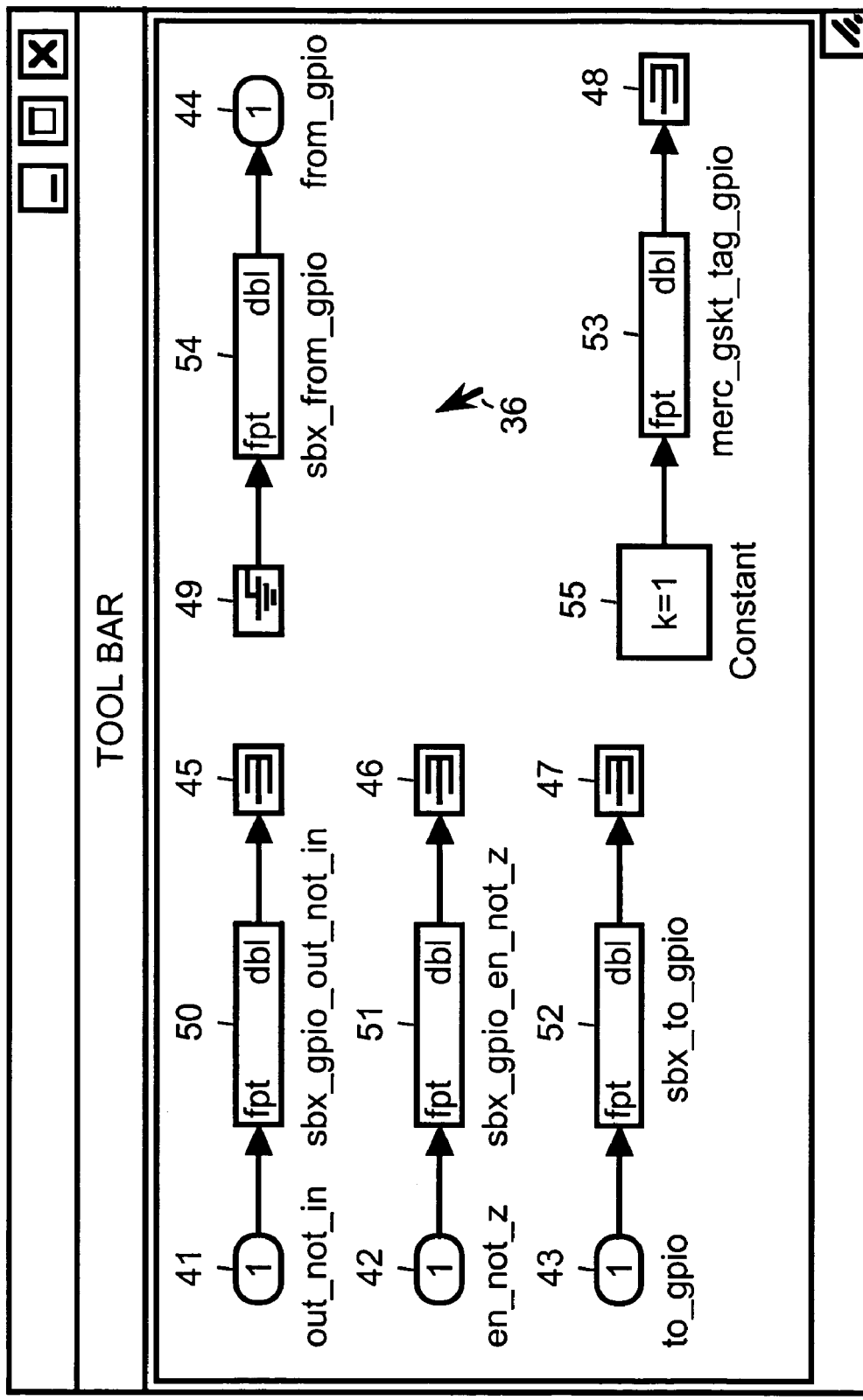

Selection of GPIO subsystem 35 with a cursor 36 opens a window 40, shown in FIG. 5. In FIG. 5, GPIO subsystem 35 is shown implemented in graphical, high-level application design and simulation environment 14 as the blocks shown in window 40. At this level, the port names pertaining to GPIO subsystem 35 are visible.

An sbx_gpio_out_not_in block 50 is connected between an out_not_in connector 41 and a termination 45. An sbx_gpio_en_not_z block 51 is connected between an en_not_z connector 42 and a termination 46. An sbx_gpio_to_gpio block 52 is connected between a to_gpio connector 43 and a termination 47. A merc_gskt_tag_gpio block 53 is connected between a constant 55 and a termination 48. An sbx_gpio_from_gpio block 54 is connected between a ground 49 and a from_gpio connector 44. Termination blocks may be present only to suppress simulation-time warnings about unloaded or un-driven elements.

Merc_gskt_tag_gpio block 53 is an artifact that is sought for by HDL adjust component 67 during merge preparation process 16. The artifact serves to indicate the position within the design hierarchy at which the designer using graphical, high-level application design and simulation environment 14 has placed the gpio subsystem. Equivalently, the artifact indicates to HDL adjust component 67 what name transformation, if any, the sibling blocks (sbx_gpio_out_not_in block 50, sbx_gpio_en_not_z block 51, sbx_gpio_to_gpio block 52, sbx_gpio_from_gpio block 54) underwent during the HDL generation performed by HDL generator 64. Because names matching a particular pattern, for example, "*_gskt_tag_*", where "*" denotes any additional characters permitting a valid identifier to be formed, constitute a reserved namespace among port names used within graphical, high-level application design and simulation environment 14, HDL adjust component 67 can discern what name transformation, if any, the sibling blocks to merc_gskt_tag_gpio block 53 underwent within a design within graphical, high-level application design and simulation environment 14. This is because merc_gskt_tag_gpio block 53 will also be subject to any name transformation that is in effect as HDL code is generated for GPIO subsystem 35.

Sbx_gpio_out_not_in block 50, sbx_gpio_en_not_z block 51, sbx_gpio_to_gpio block 52 and sbx_gpio_from_gpio block 54 produce four corresponding port names for GPIO subsystem 35 as viewed in window 30 generated by graphical, high-level application design and simulation environment 14 (shown in FIG. 4). It is essential that the port names can be reconciled by HDL adjust component 67 during merge preparation process 16, through name changes in the HDL if necessary, with corresponding port names listed in infrastructure 12. This will enable logic synthesizer 68 to produce netlists 77 (shown in FIG. 3) which can be readily merged with netlists 71, by hardware build tools 66.

Figure 6:
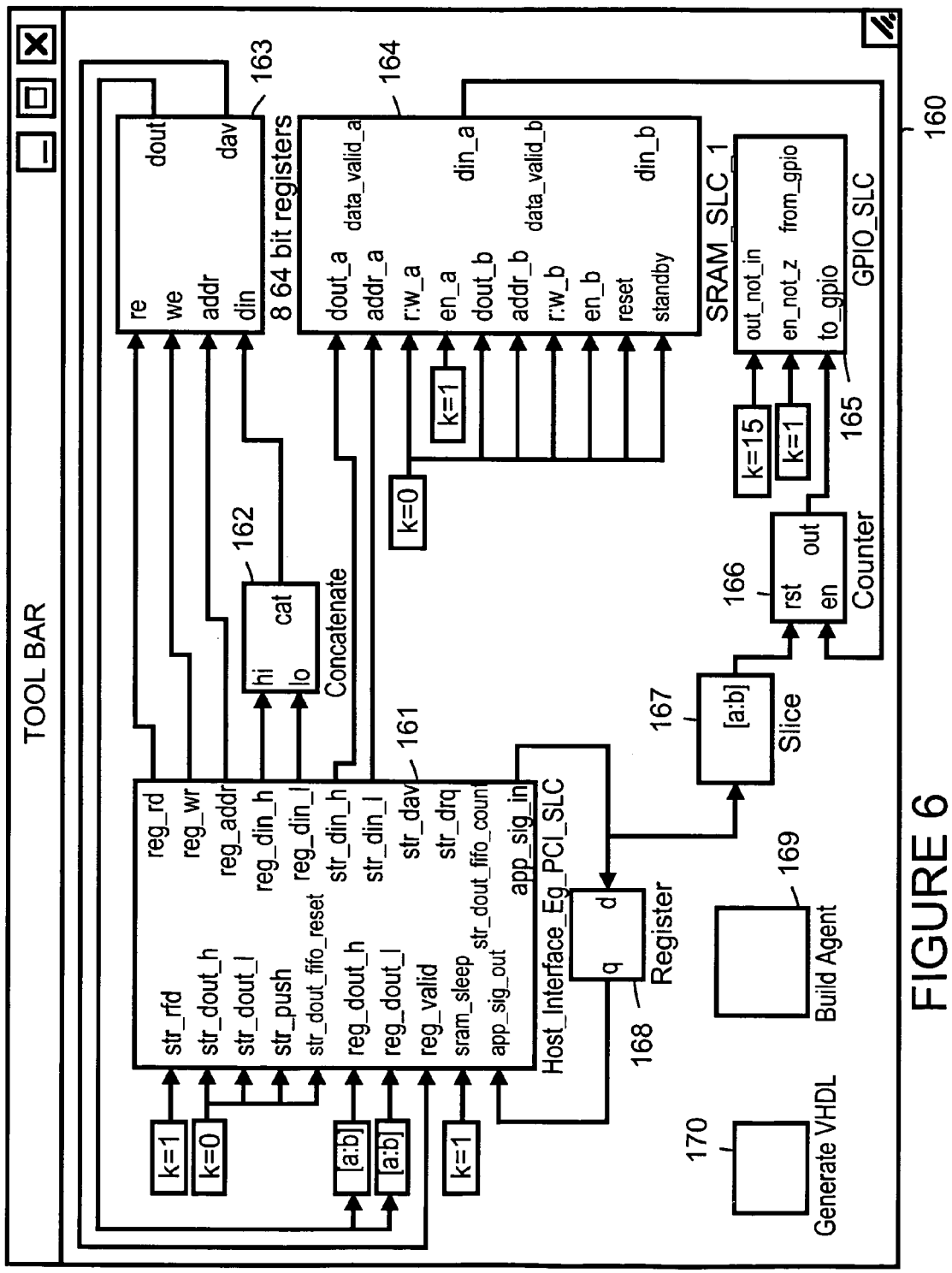
FIG. 6 shows an example of a top-level view for an application design/simulation environment in accordance with an embodiment of the present invention.

FIG. 6 shows an example of a top-level view for an application design/simulation environment. Within a window 160, a GPIO SLC 165 (essentially a subsystem, whose contents are shown in detail in FIG. 5), a host interface PCI SLC 161 and an SRAM SLC 164 are shown. In addition, a concatenate logic device 162, an eight 64-bit registers subsystem 163, a counter logic element 166, a slice logic element 167 and a register logic element 168 are shown. Also, a generate VHDL button 170 and a build agent button 169 are shown.

As can be seen, in the disclosed embodiment of the present invention, it is not necessary to show all the ports from all the SLC units in the application developer's top-level view. It is these ports that collectively define the connectivity between the primary logic component and the infrastructure, which includes the SLCs. For applications using present-day PLDs these ports can easily number in the hundreds. Essentially, this is due to the high I/O pin count for these integrated circuits, and the large number of I/O interfaces that can therefore be presented to the primary logic component. The actions of HDL adjust component 67 eliminate the need to present these ports in the application developer's top-level view, and thereby significantly simplify this view. It is these actions which also allow a user of the high-level, graphical application design and simulation environment to push the SLC representations into separate and arbitrarily deeply nested subsystems, wrap them in user-specified logic, and cause them to manifest with alternative or more abstract interfaces, without resorting to changes in the low-level, infrastructure-related HDL.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for designing a circuit comprising:
generating netlists for subsystems of infrastructure for the circuit within a first hardware description language development environment;
generating hardware description language for a primary logic component using a graphical design tool, the hardware description language including representations of the subsystems of the infrastructure;
performing an adjust process to reconcile ports for the subsystems, as represented in the hardware description language generated using the graphical design tool, with the generated infrastructure, the adjust process resulting in adjusted hardware description language; and,
generating a design for the circuit by merging the infrastructure and the adjusted hardware description language.

2. The method of claim 1 wherein the circuit is a programmable logic device.

3. The method of claim 1 wherein the primary logic component performs at least one of the following:
digital signal processing algorithms;
mathematical operations associated with at least one of the following:
measurement,
test,
control,
communications.

4. The method of claim 1 wherein the infrastructure performs input/output functions for the primary logic component.

5. A development environment comprising:
a graphical design tool that allows a designer to design a primary logic component of a circuit, the graphical design tool generating modules using a hardware description language to represent the primary logic component of the circuit, the modules including abstract references to infrastructure for the circuit; and,
a build agent that synthesizes the modules into netlists and merges the netlists with a description of the infrastructure for the circuit, netlists for the infrastructure having been generated in a development environment separate from the graphical design tool, the build agent including:
an adjuster that adjusts the modules, including replacing the abstract references to the infrastructure, with actual references utilized within the infrastructure.

6. The development environment of claim 5 wherein the abstract references to the infrastructure include ports of subsystems contained within the infrastructure.

7. The development environment of claim 5 wherein the graphical design tool includes an infrastructure chooser that allows the designer to select sets of infrastructure to include within the circuit.

8. The development environment of claim 5 wherein subsystems of the infrastructure include at least one of the following:
- circuitry to provide clocks to digital logic;
- circuitry to provide synchronization to digital logic;
- an interface to an application specific integrated circuit;
- an interface to a microprocessor;
- an interface to a microcontroller;
- an interface to a digital signal processor;
- an interface to a programmable logic device;
- an interface to a communications integrated circuit;
- an interface to a communications subsystem;
- an interface to a bus;
- an interface to a memory subsystem;
- an interface to an analog-to-digital converter;
- an interface to a digital-to-analog converter;
- an interface to a transducer;
- an interface to a general-purpose input/output subsystem.

9. The development environment of claim 5 wherein the circuit is a programmable logic device.

10. The development environment of claim 5 wherein the primary logic component performs at least one of the following:
- digital signal processing algorithms;
- mathematical operations associated with at least one of the following:
    - measurement,
    - test,
    - control,
    - communications.

11. The development environment of claim 5 wherein the infrastructure performs input/output functions for the primary logic component.

12. A development environment comprising:
- design means for allowing a designer to design, within a graphical design environment, a primary logic component of a circuit, the design means generating modules using a hardware description language to represent the primary logic component of the circuit, the modules including abstract references to infrastructure for the circuit; and,
- merging means for synthesizing the modules into netlists and merging the netlists with a description of the infrastructure for the circuit, netlists for the infrastructure having been generated in a development environment separate from the design means, the merging means including:
    - adjusting means for adjusting the modules, including replacing the abstract references to the infrastructure, with actual references utilized within the infrastructure.

13. The development environment of claim 12 wherein the abstract references to the infrastructure include ports of subsystems contained within the infrastructure.

14. The development environment of claim 12 wherein the design means includes an infrastructure chooser that allows the designer to select subsystems of infrastructure to include within the circuit.

15. The development environment of claim 12 where subsystems of the infrastructure include at least one of the following:
- circuitry to provide clocks to digital logic;
- circuitry to provide synchronization to digital logic;
- an interface to an application specific integrated circuit;
- an interface to a microprocessor;
- an interface to a microcontroller;
- an interface to a digital signal processor;
- an interface to a programmable logic device;
- an interface to a communications integrated circuit;
- an interface to a communications subsystem;
- an interface to a bus;
- an interface to a memory subsystem;
- an interface to an analog-to-digital converter;
- an interface to a digital-to-analog converter;
- an interface to a transducer;
- an interface to a general-purpose input/output subsystem.

16. The development environment of claim 12 wherein the circuit is a programmable logic device.

17. The development environment of claim 12 wherein the primary logic component performs at least one of the following:
- digital signal processing algorithms;
- mathematical operations associated with at least one of the following:
    - measurement,
    - test,
    - control,
    - communications.

18. The development environment of claim 12 wherein the infrastructure performs input/output functions for the primary logic component.

19. The development environment of claim 12 wherein constraints for the infrastructure are also generated in the development environment separate from the design means.

20. The development environment of claim 5 wherein constraints for the infrastructure are also generated in the development environment separate from the graphical design tool.

* * * * *

UNITED STATES PATENT AND TRADEMARK OFFICE
CERTIFICATE OF CORRECTION

| | | |
|---|---|---|
| PATENT NO. | : 7,203,922 B2 | Page 1 of 1 |
| APPLICATION NO. | : 10/858765 | |
| DATED | : April 10, 2007 | |
| INVENTOR(S) | : Hamilton et al. | |

It is certified that error appears in the above-identified patent and that said Letters Patent is hereby corrected as shown below:

In column 8, line 63, in Claim 5, after "infrastructure" delete ",".

Signed and Sealed this

Eighteenth Day of September, 2007

JON W. DUDAS
*Director of the United States Patent and Trademark Office*